(12) United States Patent
Vaaler et al.

(10) Patent No.: US 8,305,105 B2
(45) Date of Patent: Nov. 6, 2012

(54) SIMULATED MOUNTING STRUCTURE FOR TESTING ELECTRICAL DEVICES

(75) Inventors: Erik Vaaler, Redwood City, CA (US); Amir Torkaman, San Francisco, CA (US); George Panotopoulos, Berkley, CA (US)

(73) Assignee: NovaSolar Holdings Limited, Tortola (VG)

( * ) Notice: Subject to any disclaimer, the term of this patent is extended or adjusted under 35 U.S.C. 154(b) by 520 days.

(21) Appl. No.: 12/292,082

(22) Filed: Nov. 12, 2008

(65) Prior Publication Data

US 2010/0117671 A1    May 13, 2010

(51) Int. Cl.
*G01R 31/26* (2006.01)
(52) U.S. Cl. .................................... 324/761.01
(58) Field of Classification Search ............. 324/761.01, 324/760.01, 760.02
See application file for complete search history.

(56) References Cited

U.S. PATENT DOCUMENTS

| 7,071,716 | B2 * | 7/2006 | Swart ........................ 324/756.01 |
| 2005/0199279 | A1 * | 9/2005 | Yoshimine et al. ............ 136/251 |
| 2006/0261817 | A1 * | 11/2006 | Poddany ....................... 324/451 |
| 2007/0296426 | A1 * | 12/2007 | Krishnaswami et al. ..... 324/754 |
| 2009/0077805 | A1 * | 3/2009 | Bachrach et al. ........ 29/890.033 |

* cited by examiner

*Primary Examiner* — Roberto Velez
(74) *Attorney, Agent, or Firm* — Schwabe, Williamson & Wyatt, P.C.

(57) ABSTRACT

A testing apparatus or test jig is configured to accept a electrical device for testing prior to final assembly. In one example, a pair of conductive conveying belts compliantly engage a partially assembled photovoltaic (PV) module by its sides, and electrodes engage orthogonal sides of the module. The test apparatus or jig can be use for a variety of electrical tests, and may, for example be connected to a high potential (HiPot) tester.

20 Claims, 6 Drawing Sheets

SIMULATED MOUNTING STRUCTURE FOR
TESTING ELECTRICAL DEVICES

BACKGROUND

1. Field

This disclosure relates manufacture and testing of electrical devices prior to final assembly, and has particular application to performing tests on partially assembled electrical devices such as solar modules.

2. Background

Many electric devices, appliances and sources require dielectric voltage-withstand tests to ensure that they offer adequate protection from electric shock to their operators and users. Many such tests verify isolation between the electrically energized parts of the device and its mounting structure. In many cases the test is performed after assembly, and then the components must be disassembled to correct the detected defects. It is desired to be able to perform such tests in a manner that does not require that the component be fully assembled to its mounting structure prior to testing. This provides test results before final mounting and allows correction of the defect prior to final assembly.

Existing test methods require the user to select a mounting structure, assemble it on the device, and then run the dielectric voltage-withstand test. If such a test fails, the source of the failure needs to be identified and the device and/or mounting structure re-worked or scraped.

One existing test procedure is the "dielectric voltage-withstand test" set forth by Underwriters' Laboratories (UL). In the dielectric voltage-withstand test, an electrical device under test is tested to determine if the insulation of the electrically energized parts of the electrical device and exposed surfaces is able to withstand a predetermined voltage. In one example, applied to solar modules, the "withstand" voltage is two times the system voltage plus 1000 volts without the leakage current exceeding 50 µA. In order to accomplish this, the electrical device under test is energized at a predetermined voltage (two times the system voltage+1000 volts), with a second test electrode at the exposed surface.

One of the issues with testing is the ability to achieve testing prior to final assembly. If repairs or other modifications are to be made to the device as a result of the testing, it is desired to be able to effect such repairs prior to final assembly.

SUMMARY

Testing electrical devices is performed in a jig with at least one conductive frame element. The electrical device is positioned, in at least a partially unassembled state. The electrical device is positioned in electrical contact with the conductive frame element on a first side so as to establish electrical contact with the electrical device. An electrode is placed in communication with electrically energized parts on the electrical device through an electrical contact point. The conductive frame element and the electrode act as electrical contact connectors for testing the electrical device.

DETAILED DESCRIPTION

Overview

Figure 1:
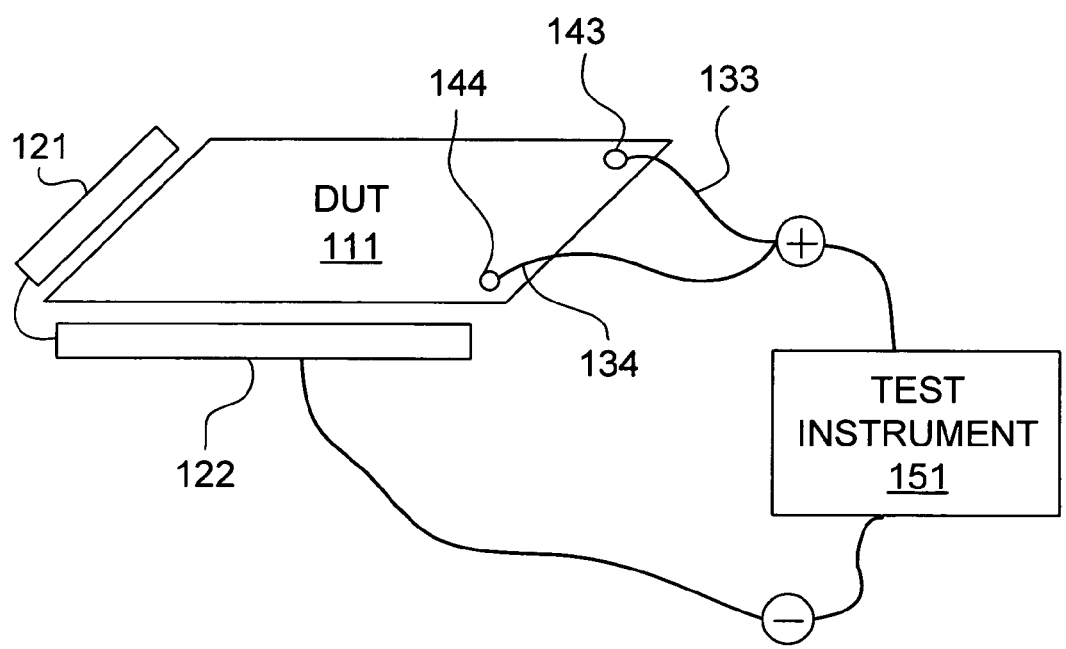
FIG. 1 is a schematic diagram showing the configuration for performing a high potential (HiPot) test on a Device Under Test (DUT).

The present disclosure provides an ability for testing for a number of different mounting schemes without requiring the mounting structure to be present during the test.

A temporary mounting arrangement is provided for testing a Device Under Test (DUT). The DUT can, by way of non-limiting example, take the form of a PV module. The disclosed approach comprises or consists of using a simulated mounting structure, that can be easily applied and removed from the device, and which allows for testing of a number of different possible mounting configurations at once.

While photovoltaic modules are described, the technique is also applicable to a large number of electrical devices, such as displays and printed circuit boards.

Uneven Device Topography

In order to compensate for uneven device topography, the simulated structure may be made compliant and uniformly preloaded against the test area on the device. This helps to create good electrical contact. The technique works for other types of appliances or devices, and the DUT can potentially be any shape and the location of the contacts anywhere on it. An additional advantage is that the compliant frame element or electrode may perform tests more stringently than would be achieved by mounting in the usual housing to the frame. This is because the compliant feature makes full contact, whereas the frame and housing might only contact part of the contact surface. It is contemplated that the belt, frame element, electrode, or any combination may be compliant.

EXAMPLE

Solar Module Test for Safety Standard

As an example, consider the dielectric voltage-withstand test for solar modules mandated by a safety certification agency, such as Underwriters' Laboratories certification UL 1703, section 43. For this test the positive and negative terminals of a solar module must be shorted and connected to one terminal of a high potential (HiPot) tester, and the other terminal of the high potential (HiPot) tester must be connected to the mounting structure of the module.

In the example, the mounting structure of the module is a type of frame that surrounds the edges and back of the module. In this case, the existing approach would be to assemble the entire frame to the module and run the test. Since many module frames involve lamination and cured adhesives, the existing approach may be irreversible. An assembled module that fails may be impossible to repair and therefore may need to be scrapped. The resultant waste increases the cost of production and may also burden the disposal environment.

In a test setup used with the present technique, a test apparatus or jig is provided with electrodes. The electrodes are positioned such that, when an unmounted module is placed in the test apparatus or jig, all four edges of the module, which would be covered by a frame after complete assembly, are brought into contact with electrodes. The test apparatus or jig and the electrodes therefore simulate the presence of the frame. By ensuring that these electrodes fully contact the entire length of all four sides of the module it is possible to deduce that if the module passes the test with the electrodes simulating a frame, it would also pass the test with an edge-mounted frame installed. This test also verifies that the "edge deletion" process, which removes all the active and conductive films from the module edges to electrically isolate the PV cells from the frame (a common process in the manufacture of PV modules), is successful. If the back of the module is also to be covered by a backsheet, backcap, or backcoating during operation, the test apparatus or jig may include a conductive pad that engages the back of the module to test the dielectric strength of the backing.

FIG. 1 is a schematic diagram showing the configuration for performing a high potential (HiPot) test on a device under test (DUT) 111. One or more ground electrodes 121, 122 are connected to locations on the DUT 111. The locations may be conductive parts which would be contacted by a frame after full assembly. Probe electrodes 133, 134 are connected to the normal operating terminals 143, 144 of the DUT 111. Probe electrodes 133, 134 are electrically connected. The test measurement, collected by tester 151, is the current between ground electrodes 121, 122 and probe electrodes 133, 134, which is the pathway for current leakage. In this test, the +/−polarity of the ground electrodes 121, 122 and probe electrodes 133, 134 can be subsequently reversed, so as to test for leakages under both polarities.

Figure 2:
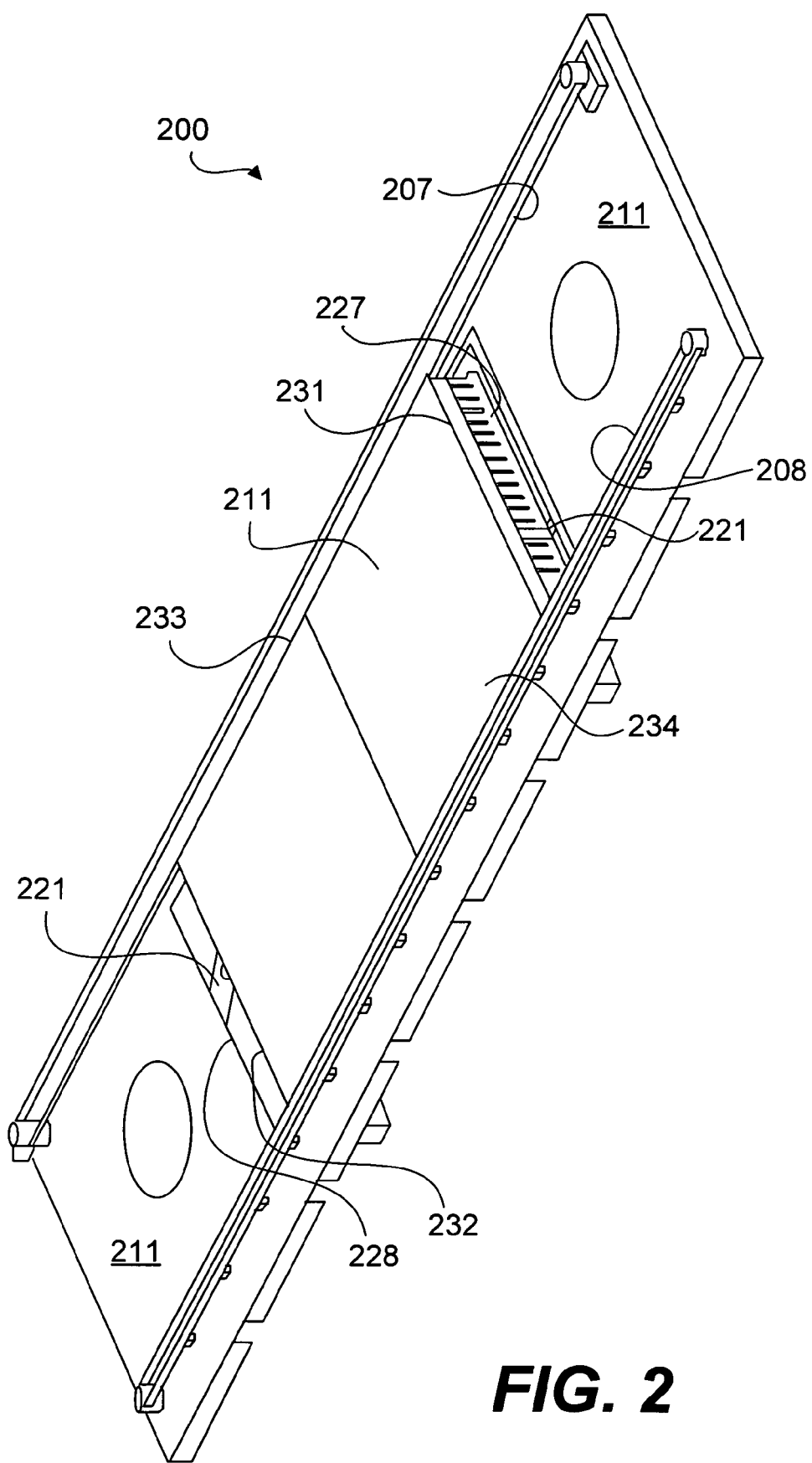
FIG. 2 is a diagram showing a possible implementation of such a simulated frame test apparatus or jig, taken from a top oblique view.

FIG. 2 is a diagram showing a possible implementation of such a simulated frame test apparatus or jig 200. The apparatus 200 has conductive frame elements, which in the example are belts 207, 208. Belts 207, 208 engage a solar module 211 in order to hold the solar module 211. In the example, the solar module 211 is loaded in place using the conductive belts 207, 208. Pneumatic cylinders 221 apply compliant electrodes 227, 228 to short sides 231, 232 of the module 211, while the belts 207, 208 act as electrodes for the long sides 233, 234.

Figure 3:
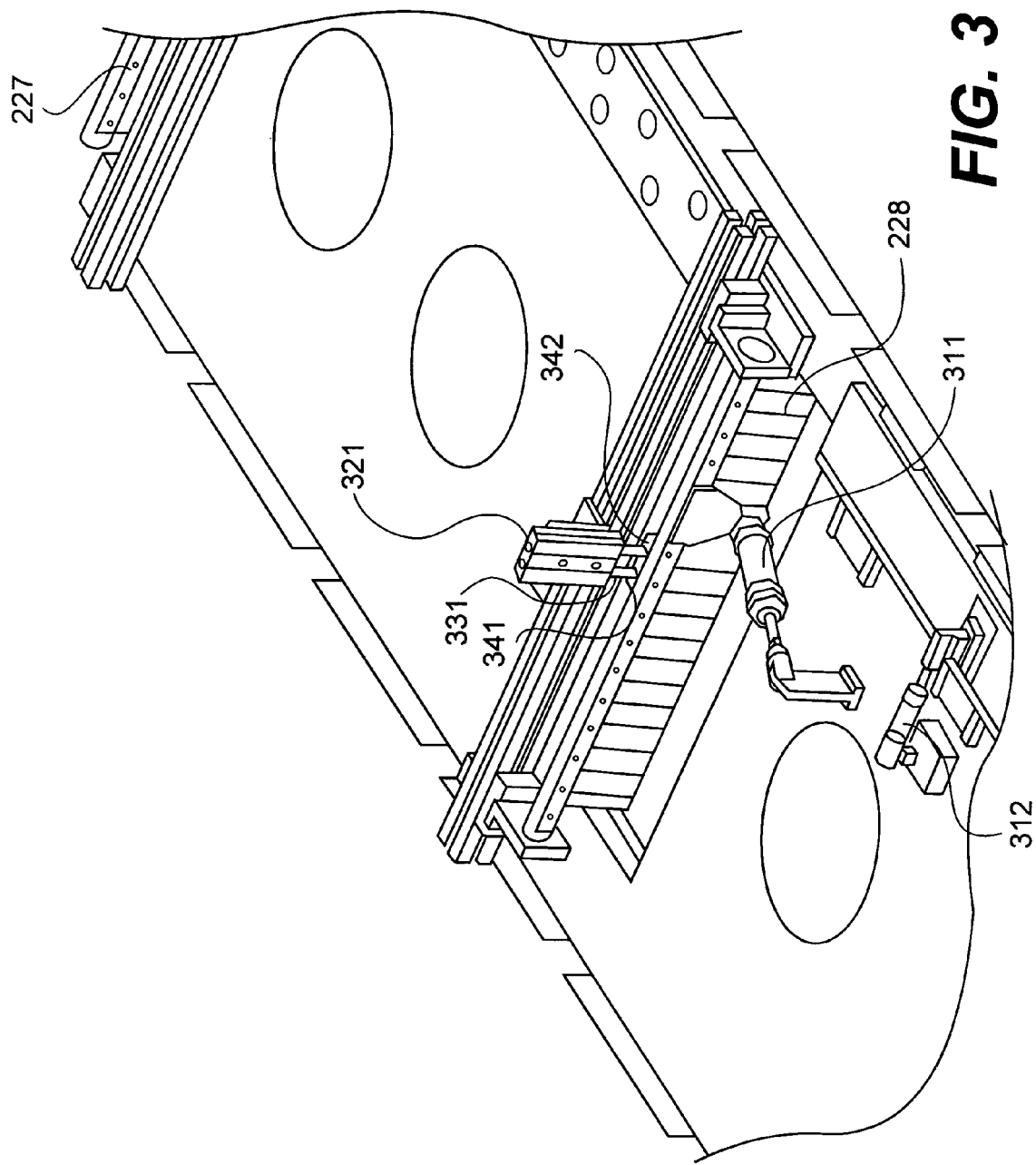
FIGS. 3 and 4 are diagrams showing details of engagement of the test apparatus or jig of FIG. 2, taken from bottom oblique views which show the side of the jig opposite to the one shown in FIG. 2.
Figure 4:
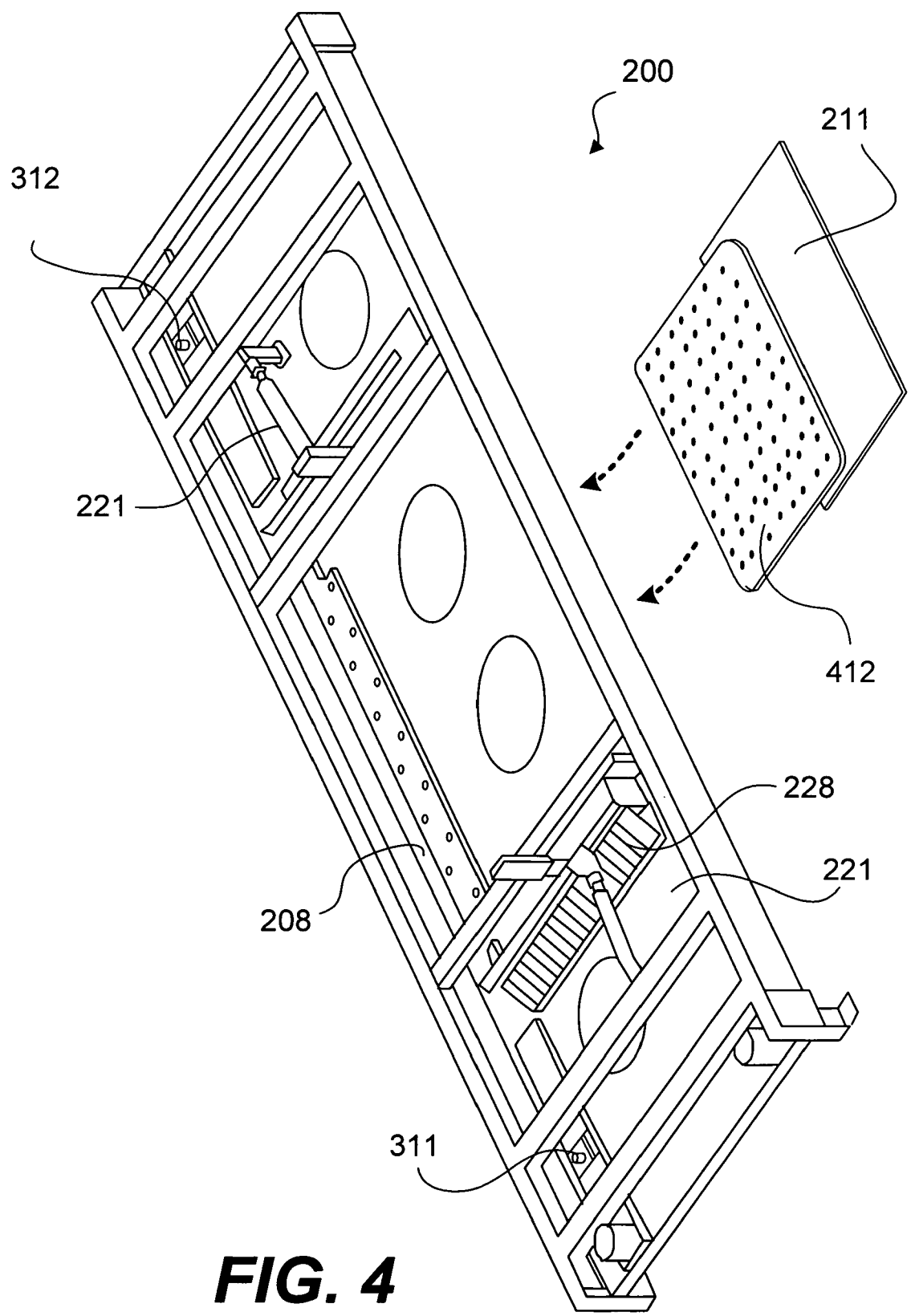

Details of engagement of the test apparatus or jig 200 with the solar module 211 are shown in FIGS. 3 and 4, which show the side of the jig opposite to the one shown in FIG. 2. The test apparatus or jig 200 provides engagement of the solar module 211 with electrodes 227, 228. Pneumatic cylinders 311, 312 place electrodes into contact with sides of the solar module 211, with cylinder 311 shown as controlling electrode 228 and cylinder 312 controlling the conductive frame elements. This results in electrical contact with the module terminals on all four sides. Pneumatic cylinder assembly 321 includes probe electrodes 331, 332, which contact positive and negative terminals 341, 342 of the module 211. For example, if the DUT is a solar module, the probes make contact with the back electrode or a structure electrically connected to the back electrode.

FIG. 4 also depicts a backplane electrode 412 mounted on the jig 200. Backplane electrode 412 is made of compliant conductive material, in order to achieve contact over a substantial area of the backplane of the DUT 111 (not shown in FIG. 4). In one configuration, the backplane electrode is formed of compliant foam. Backplane electrode 412 can be used for test sequences in which electrical contact with the backplane of the DUT 111 is implemented. Under these circumstances connections are established to run tests on the solar module 211.

Application of electrodes 227, 228, 207, 208 on all four sides does in no way preclude application of additional electrodes on areas where other mounting means can be attached (e.g., a specific area on the back side of the module). Adding such electrodes allows for simultaneous testing for a number of different mounting structures. Each mounting structure can be tested independently and concurrently, so if a module is unsuitable for a specific mounting structure it might be usable with a different one. As an example, it is possible to test for any mounting structure attached to the back of the module by testing the entire back side using a compliant conductive plastic or sponge electrode, or an inflatable conductive membrane.

Figure 5:
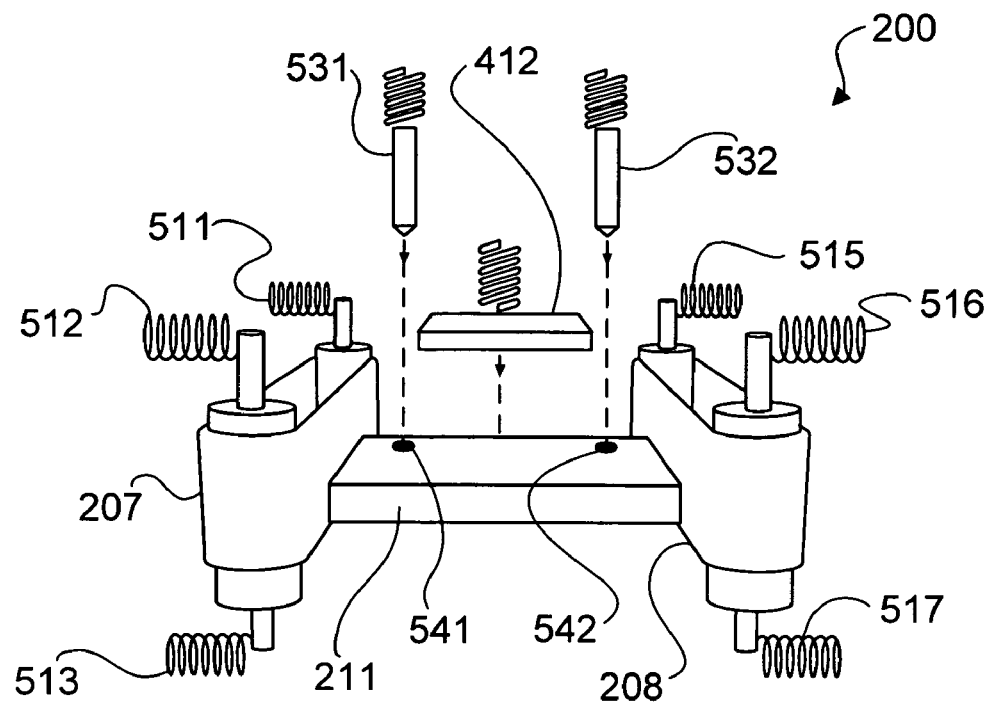
FIG. 5 is a schematic diagram showing the use of probes and the use of a test pad.

FIG. 5 is a schematic diagram showing the use of probes and the use of a test pad. Shown is DUT 211 engaged by conductive belts 207, 208. The belts are biased into engagement with the DUT 211, as schematically represented by springs 511, 512, 513, 515, 516. The actual biasing can be by springs, pneumatic pressure, electromechanical devices or any other convenient means. Test probes 531, 532 engage DUT 211 at terminals 541, 542. This is done when the DUT 211 reaches the test position and the belts and pads are pressed against the DUT 211 or are able to be pressed against the DUT 211. In a device configuration in which multiple terminals are provided, multiple test probes such as the illustrated pair of test probes 531, 532 are used, all probes are held at the same electrical potential.

Compliant conductive pad 412 engages the surface of the DUT 211 from above. Compliant conductive pad 412 engages the DUT 211 when the DUT 211 reaches the test position. In that way, the compliant conductive pad 412 can be pressed against any surfaces on the DUT 211 that are not touched by the belts 207, 208. The compliant conductive pad 412 can engage the DUT 211 from any direction, provided that the DUT has sufficient support for such engagement.

Figure 6A:
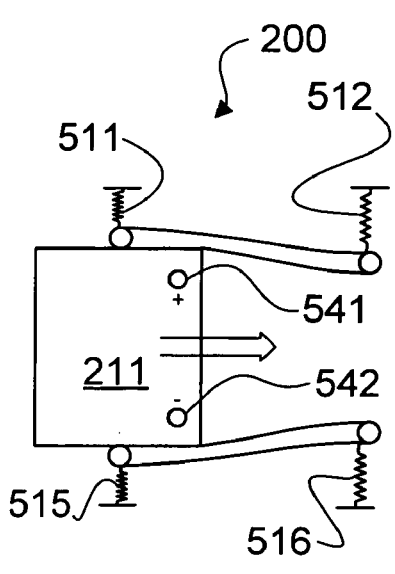
FIGS. 6A and 6B are schematic diagrams showing top views of the DUT being moved into its test position by the roller-driven compliant conductive belts.
Figure 6B:
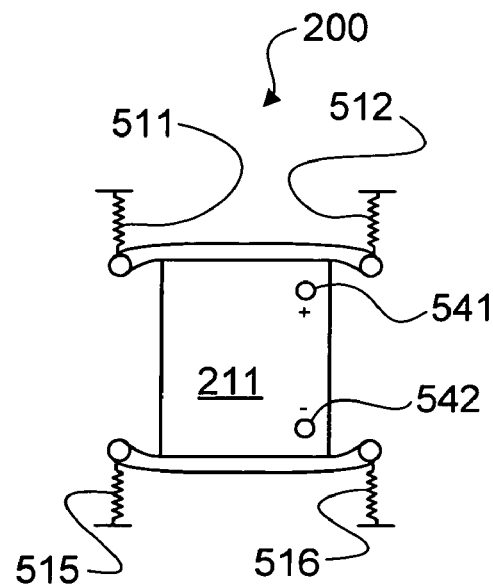

FIGS. 6A and 6B are schematic diagrams showing top views of the alignment of the DUT. In FIG. 6A, the DUT is in transit and being moved into position on the jig 200. In FIG. 6B, the DUT is in the test position.

Figure 7A:
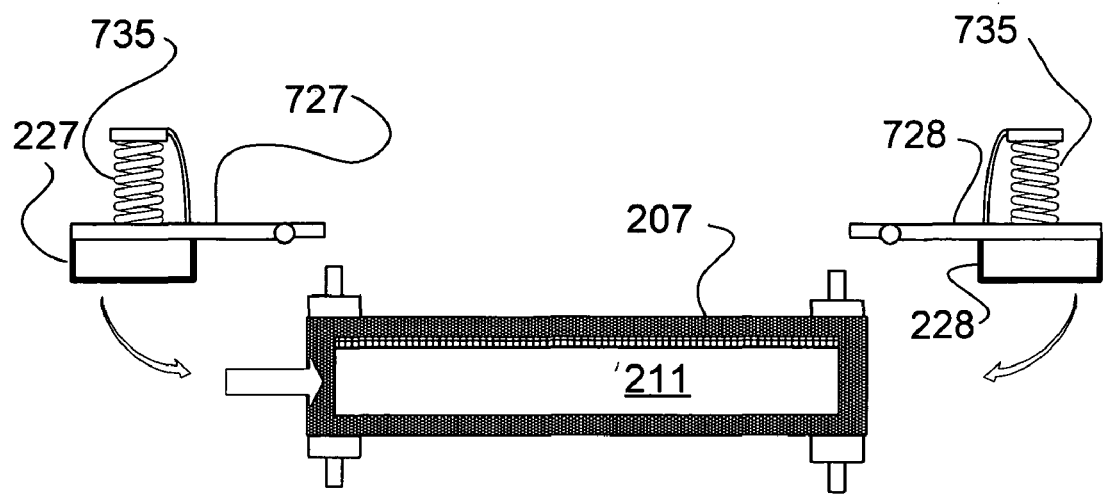
FIGS. 7A and 7B are diagrams showing end pads coming into place, taken from a side view.
Figure 7B:
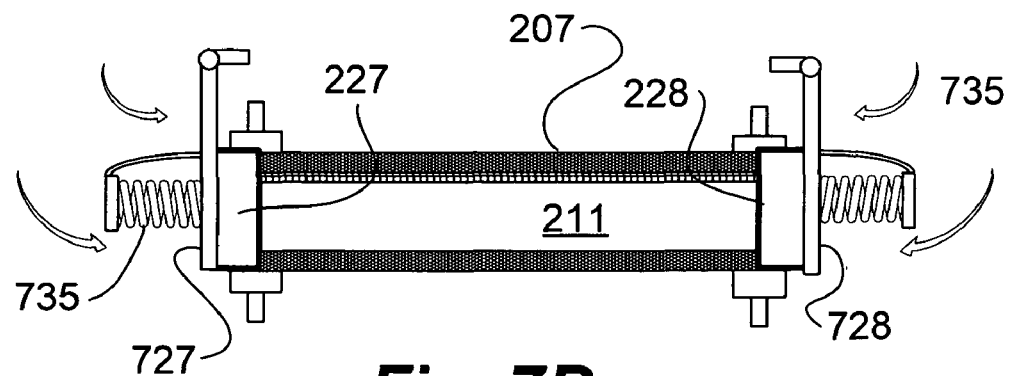

FIGS. 7A and 7A are diagrams showing end pads coming into place, taken from a side view. As depicted in FIG. 7A, DUT 211 is moved into a testing position by belts 207, as indicted by arrow 714. Compliant electrodes 227, 228 are held by hinged supports 727, 728 so as to remain out of position during movement of DUT 211 into position. After DUT 211 is in position, hinged supports 727, 728 cause compliant electrodes 227, 228 to engage DUT 211. Compliant electrodes 227, 228 are biased against DUT 211, as represented by springs 735, in order to engage end contacts on the DUT 211. The biasing (springs 735) can be achieved by any convenient means, including springs, pneumatic actuators and electromechanical devices.

Operation

In testing a solar module 211, the PV module 211, potentially in a partially unassembled state, is placed in the jig 200 as a DUT. In this configuration, the module 211 is complete except for the mounting. Belts 207, 208, which function as conductive frame elements, engage in electrical contact with the solar module 211 on sides 233, 234. Electrodes 227, 228 are used to engage in electrical contact of the solar module 211 on sides 231, 232. Belts 207, 208 and the electrodes 227, 228, 331, 332 are used as electrical contact connectors for testing the electrical device.

The described technique provides an ability to test for a number of mounting structures simultaneously. There is no need to assemble the mounting structure for the purpose of testing, and consequentially no need to and remove or scrap the mounting structures in case of failure. Since the test apparatus or jig is able to connect with electrodes on the partially assembled module 211, it is easy to integrate multiple tests on the HiPot jig. The technique provides for high potential (HiPot) testing of frameless modules. The high potential (HiPot) testing can be performed through a conductive or antistatic belt.

The test apparatus or jig 200 can be made an integral part of module handling mechanism or combined with other compatible tests, which can have the advantage of expediting manufacturing.

Conclusion

It will be understood that many additional changes in the details, materials, steps and arrangement of parts, which have been herein described and illustrated to explain the nature of the subject matter, may be made by those skilled in the art within the principle and scope of the invention as expressed in the appended claims.

What is claimed is:

1. A method for testing solar modules, comprising:
   providing a test apparatus having at least one conductive frame element disposed at a side of the test apparatus and at least one electrode disposed at an interior area of the test apparatus;
   positioning a partially assembled solar module onto the test apparatus with the at least on conductive frame element, with the at least on conductive frame element physically engaging a first edge side of the partially assembled solar module, and electrically engaging electrical elements of the partially assembled solar module disposed on the first edge side;
   engaging the at least one electrode of the test apparatus with the partially assembled solar module on an electrical contact point in communication with electrically energized elements of the solar module while the electrical elements of the first edge side are in electrical contact with the at least one conductive frame element, wherein the electrical contact point is at a second edge side of the partially assembled solar module, and the second edge side is orthogonal to the first edge side; and
   using the at least one conductive frame element and the at least one electrode as electrical contact connectors for testing the solar module.

2. The method of claim 1, wherein the at least one conductive frame element of the test apparatus comprises at least one compliant conveying belt.

3. The method of claim 2, wherein the at least one electrode of the test apparatus in communication with electrically energized elements of the solar module includes a compliant contact member.

4. The method of claim 1, wherein
   providing comprises providing, as the conductive frame element, a conductive belt; and
   the method further comprises using the conductive belt to transport the solar module into alignment with said one electrode.

5. The method of claim 1, wherein
   providing comprises providing, as the conductive frame element, conductive belts to engage with the solar module on two parallel sides of the solar module; and
   the method further comprises using the conductive belts to transport the solar module into alignment with the electrode.

6. The method of claim 1, wherein
   the solar module has substantially rectangular dimensions in said at least partially unassembled state;
   providing comprises providing, as the conductive frame element, conductive belts to engage with the solar module on two parallel sides of the solar module; and
   the method further comprises using the conductive belts to transport the solar module into alignment with the electrode.

7. The method of claim 1, wherein testing the solar module comprises performing a high potential (HiPot) test on the solar module.

8. The method of claim 1, wherein testing the solar module comprises performing a test on the solar module as a device under test (DUT).

9. Apparatus for testing partially assembled solar modules, the apparatus comprising:
   a platform frame configured to accept a partially assembled solar module;
   at least one conductive frame element disposed on at least one side of the platform frame and configured to engage against a first edge side of the partially assembled solar module to load the partially assembled solar module in place on the platform;
   an electrode disposed on an interior area of the platform frame and configured to be positioned into engagement with an electrical contact point in communication with electrically energized parts of the partially assembled solar module while the first edge side of the partially assembled solar module is in electrical contact with the at least one conductive frame element, wherein the electrical contact point is at a second edge side of the partially assembled solar module, and the second edge side is orthogonal to the first edge side; and
   electrical connections coupled with the frame element and the electrode.

10. The apparatus of claim 9, further comprising:
    a conductive belt provided as the conductive frame element; and
    a transport function coupled with the conductive belt to transport the partially assembled solar module into alignment with the electrode.

11. The apparatus of claim 9, further comprising:
    at least one compliant conductive belt provided as the conductive frame element; and
    a transport function coupled with the at least one compliant conductive belt to transport the partially assembled solar module into alignment with the electrode.

12. The apparatus of claim 9, further comprising:
    a pair of conductive belts, provided as the conductive frame element, the conductive belts engaging with the partially assembled solar module on two parallel sides of the partially assembled solar module; and
    a transport function coupled with the pair of conductive belts to transport the partially assembled solar module into alignment with the electrode.

13. The apparatus of claim 9, wherein the conductive frame element comprises at least a compliant conveying belt.

14. The apparatus of claim 9, wherein the electrode in communication with electrically energized parts includes a compliant contact member.

15. The apparatus of claim 9, further comprising a high potential (HiPot) tester in communication with the conductive frame element and the electrode.

16. Apparatus for testing solar modules, comprising:
    a platform configured to accept a solar module having substantially rectangular dimensions, wherein the platform includes at least one frame element disposed on at least one side of the platform and configured to load the solar module in place on the platform;

first electrode means, integral with the at least one frame element, to electrically contact the solar module, when the at least one frame element is configured to engage first edge side of the solar module;

second electrode means, disposed on an interior area of the platform, for engaging the solar module on an electrical contact point in communication with electrically energized parts of the solar module at a second edge side of the solar module while the first edge side of the solar module is engaged with the at least one frame element, wherein the second edge side is orthogonal to the first edge side; and means for using the first and second electrode means as electrical contact connectors for testing the solar module.

17. The apparatus of claim 16, wherein the frame element comprises compliant contact means configured to convey the solar module into a test position.

18. The apparatus of claim 16, wherein the at least one frame element comprises at least a compliant conveying belt.

19. The apparatus of claim 16, wherein the at least one frame element includes at least one conductive belt configured to engage with the solar module on at least one of two parallel sides of the solar module to form the first electrode means.

20. The apparatus of claim 16, means for using the first and second electrode means include means for using the first and second electrode means to perform a high potential (HiPot) test on the solar module.

* * * * *